(12) United States Patent
Hosseini Teherani

(10) Patent No.: US 7,094,288 B2
(45) Date of Patent: Aug. 22, 2006

(54) METHOD FOR PRODUCING A POSITIVELY DOPED SEMICONDUCTOR WITH LARGE FORBIDDEN BAND

(76) Inventor: Ferechteh Hosseini Teherani, 25 rue Alphonse Picard, F-91190 Gif-sur-Yvette (FR)

( * ) Notice: Subject to any disclaimer, the term of this patent is extended or adjusted under 35 U.S.C. 154(b) by 0 days.

(21) Appl. No.: 10/455,291

(22) Filed: Jun. 5, 2003

(65) Prior Publication Data

US 2003/0226499 A1 Dec. 11, 2003

Related U.S. Application Data

(63) Continuation of application No. PCT/FR01/03843, filed on Dec. 5, 2001.

(30) Foreign Application Priority Data

Dec. 7, 2000 (FR) .................................. 00 15900

(51) Int. Cl.
*C30B 25/12* (2006.01)
(52) U.S. Cl. .............................. 117/86; 117/89; 117/90; 117/106
(58) Field of Classification Search .................. 117/86, 117/89, 90, 97, 106
See application file for complete search history.

(56) References Cited

U.S. PATENT DOCUMENTS 6,527,858 B1 * 3/2003 Yoshida et al. ............. 117/108

FOREIGN PATENT DOCUMENTS

JP PCT/JP99/05581 * 4/2000
WO WO 00/08691 2/2000

OTHER PUBLICATIONS

Sato, K. et al: "Materials design for the low-resistivity p-type ZnO and transparent ferromagnet with transition metal atom doped ZnO: Prediction vs. experiment", Mat. Res. Soc. Symp. Proc., Apr. 24-27, 2000, vol. 623, pp. 65-75, XP-001020750.
Minegishi, Kazunori et al., "Growth of p-type Zinc Oxide Films by Chemical Vapor Deposition", Nov. 1, 1997, Journal of Applied Physics vol. 36, No. 11A, pp. L1453-1455, XP002926102.
Iwata, K. et al., "Nitrogen-induced defects in ZnO: N grown on sapphire substrate by gas source MBE", Feb. 2000, Journal of Crystal Growth, vol. 209, No. 2-3, pp. 526-531.
Yamamoto, Tetsuya et al., "Unipolarity of ZnO with a wide-band gap and its solution using codoping method", Jun. 2000, Journal of Crystal Growth, vol. 214-215, pp. 552-555.

* cited by examiner

*Primary Examiner*—Felisa Hiteshew
(74) *Attorney, Agent, or Firm*—DLA Piper Rudnick Gray Cary US LLP

(57) ABSTRACT

A method of producing a p doped wide bandgap semiconductor including growing a semiconductor in the presence of an element apt acting as a surfactant at a growth surface of the semiconductor and inhibiting formation of vacancies, and doping the semiconductor with a selected p dopant.

14 Claims, No Drawings

METHOD FOR PRODUCING A POSITIVELY DOPED SEMICONDUCTOR WITH LARGE FORBIDDEN BAND

RELATED APPLICATION

This is a continuation of International Application No. PCT/FR01/03843, with an international filing date of Dec. 5, 2001, which is based on French Patent Application No. 00/15900, filed Dec. 7, 2000.

FIELD OF THE INVENTION

This invention relates to a p doped wide bandgap semiconductor and a method of fabricating/producing a p doped zinc oxide (ZnO) semiconductor.

BACKGROUND

Zinc oxide is currently employed widely in optoelectronic devices. Wurtzite ZnO is an intrinsic n type semiconductor because of deviation from stoichiometry. The natural oxygen vacancies (anionic sites) lead to a redistribution in the occupation of the anionic sites by cationic species, in this case Zinc, as interstitials. These two types of defects lead to donor levels situated at about 0.05 eV from the conduction band.

It has already been attempted to eliminate these defects to obtain p doped ZnO. A procedure consisting of a co-doping with Ga acting as donor and N as acceptor is described in M. Joseph et al., "p-type Electrical Conduction in ZnO Thin Films by Ga and N Codoping", Jpn. J. Appl. Phys., Vol. 38 (1999), pp L 1205–L 1207. The article by T. Yamamoto et al. entitled "Solution Using a Co-doping Method to Unipolarity for the Fabrication of p-type ZnO", published in the journal Jpn. J. Appl. Phys., Vol. 38 (1999), pp. L 166–L 169, also employs this codoping method.

U.S. Pat. No. 4,904,618 proposes a procedure for doping wide bandgap semiconductors such as ZnSe or ZnTe. This procedure consists of incorporating a pair of primary and secondary dopants in the crystal (for example, N and Li, respectively), and then eliminating the most mobile of the two.

A difficulty in these techniques is in controlling the incorporation mechanisms of the constituents to obtain a chemical composition of the growth front conducive to an appropriate stoichiometry of the epitaxial crystal.

It would, therefore, be advantageous to simplify these known procedures.

SUMMARY OF THE INVENTION

This invention relates to a method of producing a p doped wide bandgap semiconductor including growing a semiconductor in the presence of an element apt acting as a surfactant at a growth surface of the semiconductor and inhibiting formation of vacancies, and doping the semiconductor with a selected p dopant.

DETAILED DESCRIPTION

This invention provides a single element (rather than two), which considerably simplifies the control of the process. The element used must act as a surfactant at the growth surface of the semiconductor to inhibit formation of vacancies (of oxygen in the case of ZnO) by covering active anionic sites. The immediate result is the absence of the deviation from stoichiometry of the surface species, which has the effect of eliminating the strong n character of the semiconductor.

More particularly, the invention relates to fabricating a p doped wide bandgap semi-conductor, wherein growth of the semiconductor in the presence of an element apt acts as a surfactant at the growth surface and inhibits formation of vacancies, combined with doping the semiconductor with an appropriate p dopant. The invention applies particularly to the realization of p doped ZnO. In this case, the single element acting as a surfactant may be indium (In) or arsenic (As). The p doping can be obtained by a common dopant such as Mg or N or H. This doping is reinforced by the action of the surfactant element, which reduces the compensating behaviour by minimizing the intrinsic n-type behaviour of the material.

The procedure of the invention allows stabilization of wide band gap materials, notably materials based on Zn. Indeed, the ZnO compound grows naturally in the form $n^5$, following the desorption of Zn during the fabrication phase or later on when it is subject to treatments (for example, thermal). Use of the procedure of the invention permits stabilization of the growth front and, thus, limits desorption, which leads either to an n type material with a stable surface or a p type material when this procedure is associated with a p type doping. The material obtained can then be used as either a buffer layer, or an active layer of type n or p.

The structures can be deposited on various substrates, for example ZnO itself or a alternative substrate covered with an underlayer (buffer layer) based on ZnO or Zn. If these underlayers are n doped, then, the final structure will have both p and n type layers, permitting the obtention of p-n diodes, or of devices based on a p-n diode.

The problem of doping in wide bandgap materials must be overcome for the fabrication of devices based on p-n junctions. Indeed, intentional p type doping requires energy levels near the valence band (VB), while minimizing the compensation and activation of deep centres. The desired configuration of localized energy states in the band gap can only exist if there is a homogeneous spatial distribution of dopants during the epitaxy, which is obtained generally via a non-equilibrium growth regime. It is, thus, the synthesis procedure used during the epitaxy which control the doping.

EXAMPLES

An ultra high vacuum chamber which permits a molecular regime of the incident fluxes (the source/substrate distance being inferior to the mean free path of the species employed) is preferably used. Generally speaking, this condition can be met in the techniques called molecular beam epitaxy, cathodic sputtering (magnetron or other, R.F. or D.C.), evaporation, laser ablation or any other technique using a system which allows the establishment of a molecular regime (physical or chemical method of synthesis).

The substrate can be any of ZnO, $Al_2O_3$, GaN, Si, $SiO_2$ and the like. It is cleaned by means of commonly used techniques (thermal treatment under vacuum or oxygen, chemical treatment or the like). It is brought to an optimal temperature, which is between about 200 and about 800° C. for $Al_2O_3$, between about 200 and about 500° C. for glass or $SiO_2$ and between about 600 and about 800° C. for GaN. The growth of ZnO (with or without other elements) is obtained by a supply of Zn atoms (by MBE, evaporation, sputtering, ablation or CVD) with oxygen present. To limit the desorption of Zn, this growth is carried out in the presence of a flux of In or As or Mg, obtained from a physical or chemical source. This flux is maintained throughout the growth. Hence, to obtain n doped ZnO, the growth is carried out in the usual manner, but with a continuous flux of In (or As or Mg). To obtain p doped ZnO by codoping, the growth is carried out in the presence of a flux of N or H or Ga, with a constant flux of In (or As or Mg) to stabilize the growth front.

The growth must be non-equilibrium, a condition which leads to the management of the incorporation mechanisms via the control of incorporation kinetics specific to each element at the growth surface rather than equilibrium thermodynamics. The equilibrium states of different constituents at the growth front determine a growth stoichiometry different from that of the crystal. Through an appropriate choice of the growth conditions, these different energy states of the crystal surface are defined extrinsically. Thus, for each element there are specific requirements for the flux, the vapor pressure or the sticking coefficient on the substrate.

In the case of compounds mostly composed of ZnO, the desorption of Zn atoms at the growth surface depends on the equilibrium between the supplied kinetic energy and the vertical and horizontal interaction energies which are at the origin of the confinement of Zn atoms near the surface. The interaction energies depend on the composition of the alloy and, because of this, information concerning the surface composition of the alloy can be deduced from the desorption behaviour of the Zn atoms. The occupation of surface sites is, thus, controlled by combination of in situ characterization (such as reflected high energy electron diffraction called RHEED) and ex situ characterization (such as atomic force microscopy called AFM, or an analysis of the electrical properties, etc . . . ).

I claim:

1. A method of producing a p doped wide bandgap semiconductor comprising growing a semiconductor in the presence of an element apt acting as a surfactant at a growth surface of the semiconductor and inhibiting formation of vacancies, and doping the semiconductor with a selected p dopant.

2. The method as described in claim 1, wherein the semiconductor is zinc oxide (ZnO).

3. The method as described in claim 1, wherein the p dopant comprises nitrogen.

4. A method of producing a p doped wide bandgap semiconductor comprising growing a semiconductor in the presence of indium acting as a surfactant at a growth surface of the semiconductor and inhibiting formation of vacancies, and doping the semiconductor with a selected p dopant.

5. A method of producing a p doped wide bandgap semiconductor comprising growing a semiconductor in the presence of arsenic acting as a surfactant at a growth surface of the semiconductor and inhibiting formation of vacancies, and doping the semiconductor with a selected p dopant.

6. A method of producing a p doped wide bandgap semiconductor comprising growing a semiconductor in the presence of an element apt acting as a surfactant at a growth surface of the semiconductor and inhibiting formation of vacancies, and doping the semiconductor with magnesium as a p dopant.

7. A method of producing a p doped wide bandgap semiconductor comprising growing a semiconductor in the presence of an element apt acting as a surfactant at a growth surface of the semiconductor and inhibiting formation of vacancies, and doping the semiconductor with hydrogen as a p dopant.

8. A method of producing a p doped wide bandgap semiconductor comprising growing a semiconductor in the presence of a surfactant at a growth surface of the semiconductor to inhibit formation of vacancies, and doping the semiconductor with a selected p dopant.

9. The method as described in claim 8, wherein the semiconductor is zinc oxide (ZnO).

10. The method as described in claim 8, wherein the surfactant comprises indium.

11. The method as described in claim 8, wherein the p dopant comprises nitrogen.

12. The method as described in claim 8, wherein the surfactant comprises arsenic.

13. The method as described in claim 8, wherein the p dopant comprises magnesium.

14. The method as described in claim 8, wherein the p dopant comprises hydrogen.

* * * * *